(12) United States Patent
Aoki et al.

(10) Patent No.: US 10,424,510 B2
(45) Date of Patent: Sep. 24, 2019

(54) SOLDER FILL INTO HIGH ASPECT THROUGH HOLES

(71) Applicant: INTERNATIONAL BUSINESS MACHINES CORPORATION, Armonk, NY (US)

(72) Inventors: Toyohiro Aoki, Kanagawa (JP); Akihiro Horibe, Kanagawa-ken (JP); Kuniaki Sueoka, Kanagawa-ken (JP); Kazushige Toriyama, Kyoto (JP)

(73) Assignee: International Business Machines Corporation, Armonk, NY (US)

( * ) Notice: Subject to any disclaimer, the term of this patent is extended or adjusted under 35 U.S.C. 154(b) by 10 days.

(21) Appl. No.: 15/670,315

(22) Filed: Aug. 7, 2017

(65) Prior Publication Data

US 2017/0338152 A1   Nov. 23, 2017

Related U.S. Application Data

(62) Division of application No. 15/068,002, filed on Mar. 11, 2016.

(51) Int. Cl.
```
H01L 21/768     (2006.01)
H01L 21/67      (2006.01)
H01L 21/687     (2006.01)
B23K 3/06       (2006.01)
H01L 21/48      (2006.01)
```

(52) U.S. Cl.
CPC ...... *H01L 21/76898* (2013.01); *B23K 3/0607* (2013.01); *B23K 3/0638* (2013.01); *H01L 21/486* (2013.01); *H01L 21/67103* (2013.01); *H01L 21/67138* (2013.01); *H01L 21/68757* (2013.01)

(58) Field of Classification Search
CPC .............. H01L 21/76264; H01L 21/76808
See application file for complete search history.

(56) References Cited

U.S. PATENT DOCUMENTS 5,998,243 A * 12/1999 Odashima ......... B29C 45/14655
                                        257/E21.503
6,103,992 A *  8/2000 Noddin ................. H01L 21/486
                                        219/121.61
7,667,338 B2   2/2010 Lin et al.
7,772,115 B2   8/2010 Hiatt
(Continued)

OTHER PUBLICATIONS

Sumitomo Electric Fine Polymer, Inc., "Poreflon™ Membrane," Sumitomo Electric Fine Polymer, Inc., retreived Nov. 2015. (pp. 1-3). Available at: http://www.sei-sfp.co.jp/english/products/poreflon-membrane.html.

(Continued)

*Primary Examiner* — Mohammad M Choudhry
(74) *Attorney, Agent, or Firm* — Tutunjian & Bitetto, P.C.; Vazken Alexanian

(57) ABSTRACT

A method for filling a through hole with solder includes mounting a substrate having a through hole formed therein on a permeable barrier layer having pores that enable gas to flow through the permeable barrier. A solder source is positioned over the through hole. Molten solder is delivered in the through hole with a positive pressure from the solder source such that gas in the through holes passes the permeable barrier while the molten solder remains in the through hole.

20 Claims, 3 Drawing Sheets

(56) References Cited

U.S. PATENT DOCUMENTS

| | | |
|---|---|---|
| 8,117,982 B2 | 2/2012 | Gruber et al. |
| 8,381,962 B2 | 2/2013 | Grubger et al. |
| 2010/0078463 A1* | 4/2010 | Speckels .......... H01L 21/67092 228/212 |
| 2010/0193822 A1* | 8/2010 | Inobe .................... H01L 33/54 257/98 |
| 2010/0276813 A1 | 11/2010 | Belanger et al. |
| 2014/0311905 A1* | 10/2014 | Stetter .................... B01J 31/06 204/424 |

OTHER PUBLICATIONS

Asuzakku Ltd., "Porous Ceramics," Asuzac Fine Ceramics, retrieved Nov. 2015. (pp. 1-18).

List of IBM Patents or Patent Applications Treated as Related dated Aug. 7, 2017, 2 pages.

\* cited by examiner

US 10,424,510 B2

SOLDER FILL INTO HIGH ASPECT THROUGH HOLES

BACKGROUND

Technical Field

The present invention relates to integrated circuit processing, and more particularly to filling high aspect ratio through holes with solder.

Description of the Related Art

Injection Molded Solder (IMS) technology utilizes a local vacuum function under a scanning head to effectively fill molten solder into an enclosed mold space, e.g., single-end via holes. Maintaining uniform and high vacuum conditions is difficult due to the scanning feature of the head. The head moves and needs to reseal to draw a vacuum over each hole to be filled. This method makes solder filling into high aspect via holes difficult and may result in slower throughput.

SUMMARY

A method for filling a through hole with solder includes mounting a substrate having a through hole formed therein on a permeable barrier layer having pores that enable gas to flow through the permeable barrier. A solder source is positioned over the through hole. Molten solder is delivered in the through hole with a positive pressure from the solder source such that gas in the through holes passes the permeable barrier while the molten solder remains in the through hole.

Another method for filling one or more through holes with solder includes mounting a substrate having a through hole formed therein on a permeable barrier layer having pores that enable gas to flow through the permeable barrier; pressurizing a solder reservoir; positioning a scanner head over the through hole configured to deliver molten solder from the solder reservoir; delivering molten solder in the through hole with a positive pressure such that gas in the through holes passes the permeable barrier while the molten solder remains in the through hole; and repositioning the scanner head over another through hole.

A system for filling a through hole with solder includes a heating plate, a permeable substrate mounted on the heating plate and a permeable barrier disposed on the permeable substrate. The permeable barrier includes pores that enable gas to flow through the permeable barrier while preventing molten solder from flowing through the permeable barrier. The permeable barrier is configured to create an interface with a substrate having one or more through holes formed therein. A repositionable scanning head is configured to deliver molten solder to the one or more through holes with a positive pressure.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
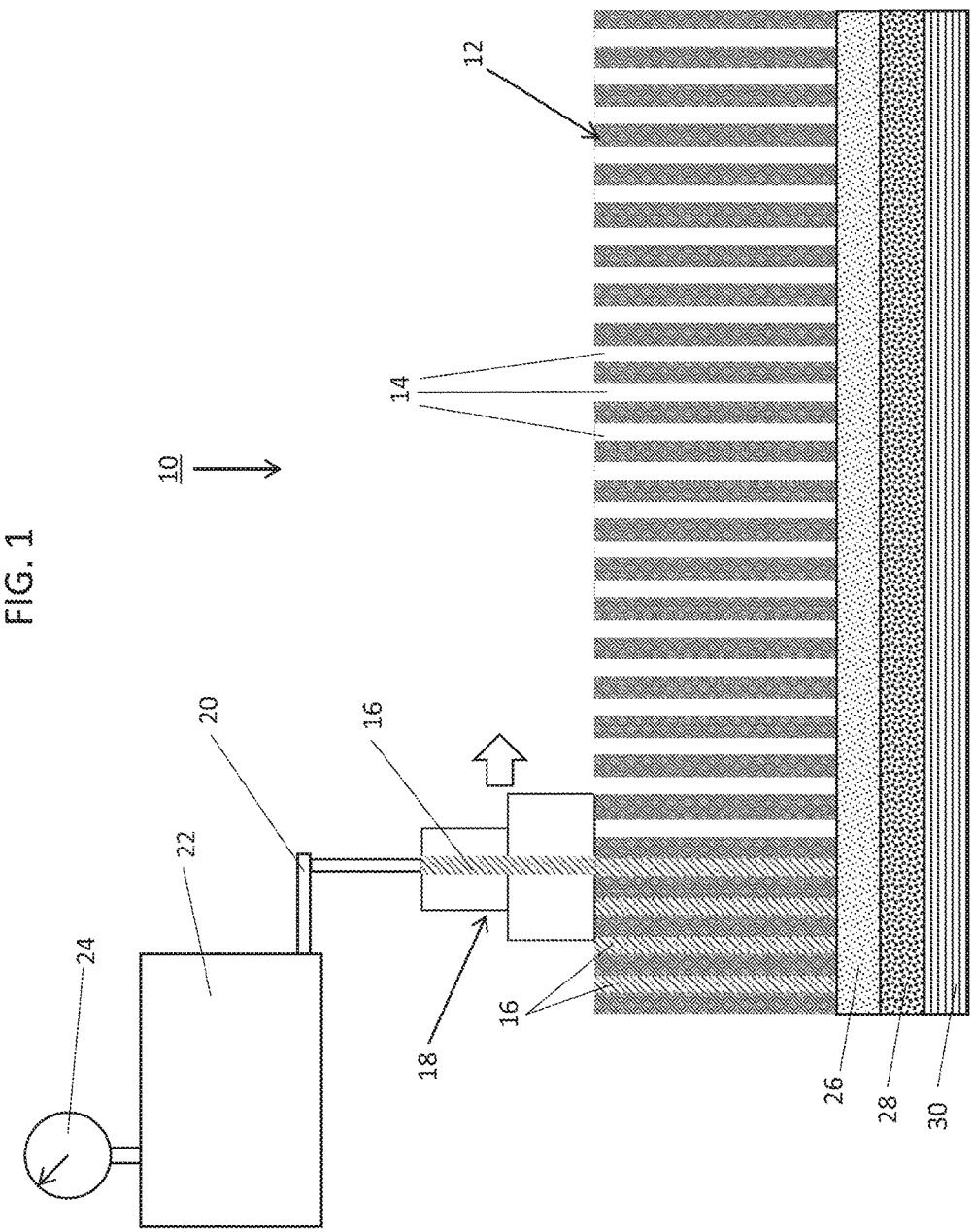
FIG. 1 is a schematic diagram of a solder filing system showing a cross-sectional view of a substrate with through holes being filled using a pressurized solder source in accordance with the present principles.

In accordance with the present principles, systems, devices and methods are provided for filling high aspect ratio through holes without the need for a local vacuum. The present principles employ a pressurized solder flow into a through hole. The through holes receive solder on a first end and interface with a permeable barrier on a second end. The permeable barrier permits gas to escape but prevents the flow of solder on a far end of the through hole. The porous or permeable barrier (e.g., polytetrafluroethylene (PTFE)) permits permeation of air and prevents permeation of molten solder. The permeable barrier may include a thin porous PTFE film that may include sub-micron pore sizes (e.g., <1 micron). The permeable barrier may be realized as a single layer or multiple layers. In addition, the permeable barrier may be supported by additional layers or structures.

In other embodiments, ultra-high molecular weight polyethylene (UHMWPE), high-density polyethylene (HDPE), polypropylene (PP), and polyvinylidene fluoride (PVDF) may be employed as materials for the permeable barrier. In still other embodiments, ethylene vinyl acetate (EVA), polyethersulfone (PES), polyurethane (PU) and polyethylene (PE)/PP co-polymer may also be employed.

In one embodiment, the permeable barrier is provided on a permeable substrate. The permeable substrate may include a ceramic material. The permeable substrate may include, e.g., $Al_2O_3$, AlN, etc. The permeable substrate also permits air permeation and heat transfer from a heating plate. The permeable substrate may be placed on a heated plate to maintain solder flow temperatures at the second end to ensure a complete fill throughout the through holes. The permeable barrier can eliminate solder-contamination of the permeable substrate (ceramic plate), and the softness (smoothness) of the permeable barrier forms a smooth solder surface. While a permeable substrate is preferably other textures and material types may also be employed for the permeable substrate.

A molten solder filling tool in accordance with the present principles includes a scanning head that injects solder into the through holes. To make high aspect vias with solder, a substrate includes open through holes through the material. The tool enables solder filling by employing higher pressure than atmospheric pressure without a local vacuum function. Higher pressure can be applied to molten solder since there is no concern of solder leakage into the vacuum system and no fear of solder leakage on the far end of the through holes due to the permeable barrier. The solder leakage into local vacuums in conventional devices could damage the expensive vacuum system. In conventional systems, the vacuum system can only provide a maximum pressure of atmospheric pressure (1 atm) to eliminate voids in the molten solder. This is a strict limitation on the pressure differential employed in solder filling. In accordance with the present embodiments, this pressure limitation is not present and a much larger pressure differential may be employed using positive pressures over atmospheric pressure.

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SnPb. These compounds include different proportions of the elements within the compound, e.g., SnPb includes $Sn_xPb_{1-x}$ where x is less than or equal to 1, etc. In addition, other elements may be included in the compound, such as, e.g., AuSnPb, CuSnPb, etc. and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, a system 10 is illustratively shown provided for filling high aspect ratio through holes without the need for a local vacuum in accordance with the present principles. A solder reservoir or delivery mechanism 22 provides solder flow into a scanning head 18. The mechanism 22 may include heating for maintaining molten solder 16. The scanning head 18 may also include heating elements or the like to maintain the flow of solder 16. The solder 16 may include a SnAgCu solder (SAC solder), although any suitable solder can be employed. In one embodiment, the mechanism 22 may pressurize the solder 16 to ensure a complete fill of through holes 14 on an integrated circuit device or substrate 12. It should be noted that the present principles are applicable to through holes with any aspect ratio, but are particularly useful for high aspect ratio through holes (e.g., 1.5 or greater).

The scanning head 18 delivers solder 16 into through holes 14. The scanning head 18 receives solder 16 through a delivery system 20. The delivery system 20 may include piping or other enclosed vessels to maintain pressure. The scanning head 18 is repositionable and is controlled to be positioned over through holes 14 to enable filling of the through holes 14 with solder 16. The relative motion of the scanning head 16 relative to the substrate 12 may be controlled by controlling movement of the scanning head 16, by controlling the movement of the substrate 12 or both.

The through holes 14 are provided through the device or substrate 12. The through holes 14 include a first end in which the solder 16 is provided for each through hole 14. The solder 16 may be pressurized to decrease fill time and to ensure a complete fill of through holes 14. The solder 16 may be pressurized e.g., using a pump or piston cylinder arrangement, pressurized gas, gravity, etc. to generate pressure within the molten solder 16. In one embodiment, a positive pressure 24 (as opposed to negative (vacuum) pressure) is applied that may be between about 1 atm to about 5 atm. In another embodiment, the hydrostatic pressure of the solder 16 may be employed (solder column). The scanning head 14 does not include a local vacuum although a local vacuum may be employed in some embodiments along with other features in accordance with the present principles to further enhance solder flow.

A permeable barrier 26 is disposed on a second end of the through holes 14. The permeable barrier 26 may be pressed against the substrate 12 or may otherwise be removably attached to the substrate 12. The permeable barrier 26 permits gas to escape from the through holes 14 when being filled with solder 16. The permeable barrier 26 is in fluid communication with the though holes 14.

The permeable barrier 26 prevents the flow of solder 16 beyond the permeable barrier 26. Pore size of the permeable barrier 26 is selected so that surface tension of the solder 26 prevents the solder 26 from entering pores of the permeable barrier 26. The porous or permeable barrier 26 may include a polymer material, such as, e.g., polytetrafluroethylene (PTFE) although other materials may be employed. For example, in other embodiments, UHMWPE, HDPE, PP and PVDF may be employed as materials for the permeable barrier 26. In still other embodiments, EVA, PES, PU and PE/PP co-polymer may be employed.

The permeable barrier 26 may include sub-micron pore sizes of, e.g., <1 micron. This permits permeation of air and prevents permeation of molten solder.

In one embodiment, the permeable barrier 26 is provided or formed on a permeable substrate 28. The permeable substrate 28 may include a ceramic material, such as, e.g., $Al_2O_3$, AlN, etc. The permeable substrate 28 also permits air permeation and heat transfer from a heat source 30, e.g., a heating plate. The permeable substrate 28 may be placed on the heat source 30 or otherwise be connected to the heat source 30. The heat source 30 provides energy to the permeable substrate 28, permeable barrier 26 and the substrate 12 to maintain solder flow temperatures at the second end of the substrate 12. By keeping the solder flowing, a complete fill throughout the through holes 14 is achieved. The permeable barrier 26 can eliminate solder-contamination of the permeable substrate 28 (ceramic plate), and the softness (smoothness) of the permeable barrier 26 forms a smooth solder surface on solidified solder through vias. Smooth surfaces reduce whiskers and therefore reduce the possibility of shorts, corrosion, and other ill-effects.

The scanning head 18 injects solder into the through holes 14. To make high aspect ratio vias with solder, scanning head 18 delivers solder 16 with a higher pressure than atmospheric pressure without a local vacuum function. Higher pressure can be applied to molten solder 16 since there is no concern of solder leakage into a vacuum system, and leakage of the solder 16 can be controlled by a clamping force of the substrate 12 against the permeable barrier 26.

In accordance with the present embodiments, a much larger pressure may be employed to achieve a pressure differential of greater than between about 0.1 atm and about 5 atm depending on the arrangement. This is not achievable by a conventional local vacuum system.

The scanning head 18 and the reservoir 22 maintain molten solder temperatures, e.g., 180 to 270 degrees C. The scanning head 18 moves from through hole 14 to through hole 14 (e.g., in the direction of arrow A in this example) at speeds of between about 0.2 mm/sec to about 1 mm/sec, preferably about 0.5 mm/sec.

Figure 2:
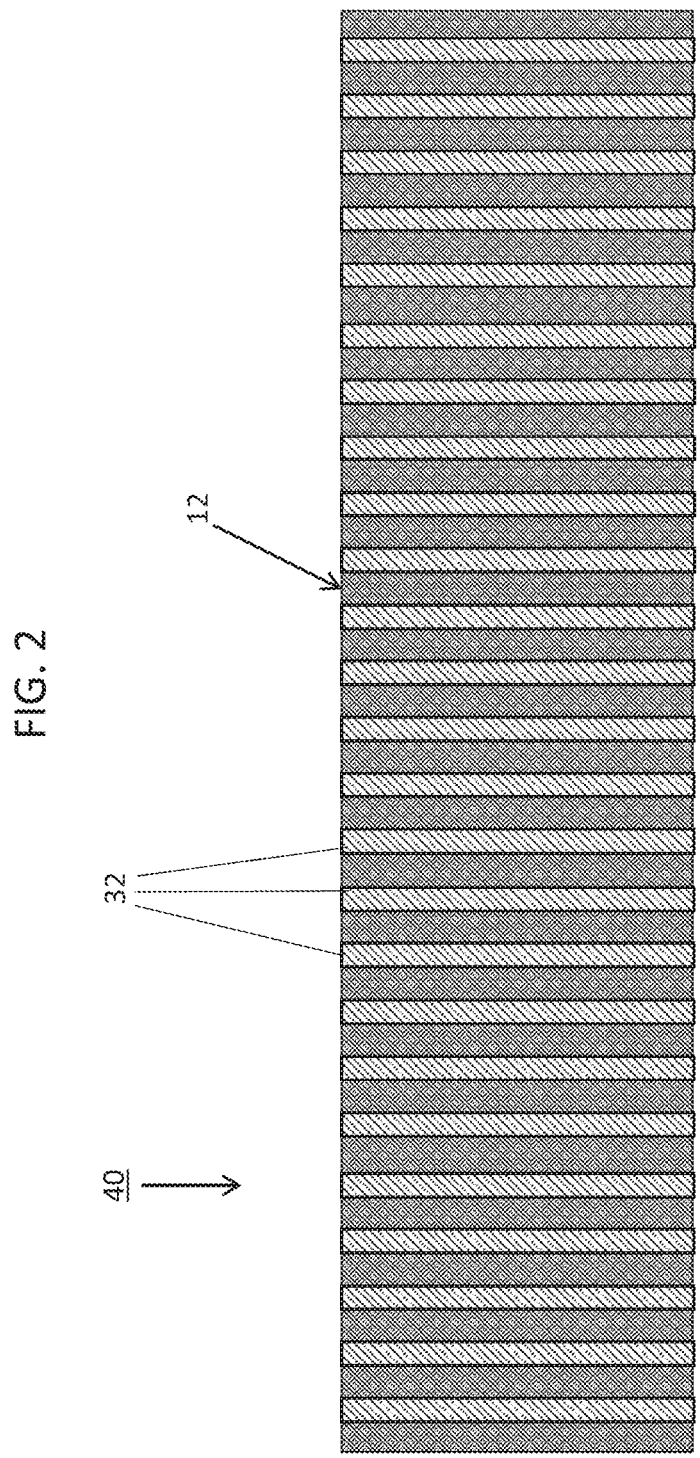
FIG. 2 is a cross-sectional view of the substrate of FIG. 1 with through holes filled with solidified solder in accordance with the present principles.

Referring to FIG. 2, a device 40 is illustratively shown with high aspect ratio through holes filled with solder in accordance with the present principles. After the through holes (14, FIG. 1) have been filled with solder, the solder is solidified to form through vias 32 through the substrate 12. The substrate 12 may include a semiconductor crystal, a glass substrate, a ceramic substrate, an epoxy resin (for printed wiring boards, etc.). The substrate 12 may include a thickness of between about 250 microns to about 1000 microns, although other thicknesses may be employed. The higher pressure and the heated porous barrier (26) enable a thicker substrate 12 to be employed. In one example, a 500 microns substrate 12 had through vias 32 formed therethrough with a thickness/diameter of approximately 40 microns. Other dimensions are contemplated as well.

In useful embodiments, through holes having aspect ratios of 25 or greater can be filled with solder in accordance with the present principles. The device 40 may include a plurality of different structures. Useful embodiments may include: high aspect ratio through via applications, all 3D/2.5D applications (stacked chips, interposers, etc.) (including, e.g., memory chip stacks), sensors, low power bio-inspired devices, through silicon vias, through glass vias, through mold vias, vias through organic substrates, etc. The present principles are not limited to semiconductor devices and are also applicable to various electrical devices with electrical connections between opposing surfaces of a substrate.

In one arrangement constructed by the present inventors, a tin-silver-copper (SnAgCu, or SAC) was employed having a melting temperature of about 220 degrees C. The scanning scan speed employed was about 0.5 mm/sec with no local vacuum on the scanning head. The permeable barrier included a porous PTFE film which had a pore size of about 0.2 microns and was configured to permit air flow while blocking liquid flow (molten solder). The permeable barrier was mounted on a porous ceramic substrate (e.g., porous alumina having a porosity of about 60%). A 500 micron thick substrate having 40 micron diameter through holes were completely filled with solder. A bottom surface of the solder vias was uniform and included a smooth surface finish. The smooth surface included a finish of less than about 0.5 microns (in useful embodiments, e.g., a surface finish of 0.05-0.20 microns RMS may be employed).

Figure 3:
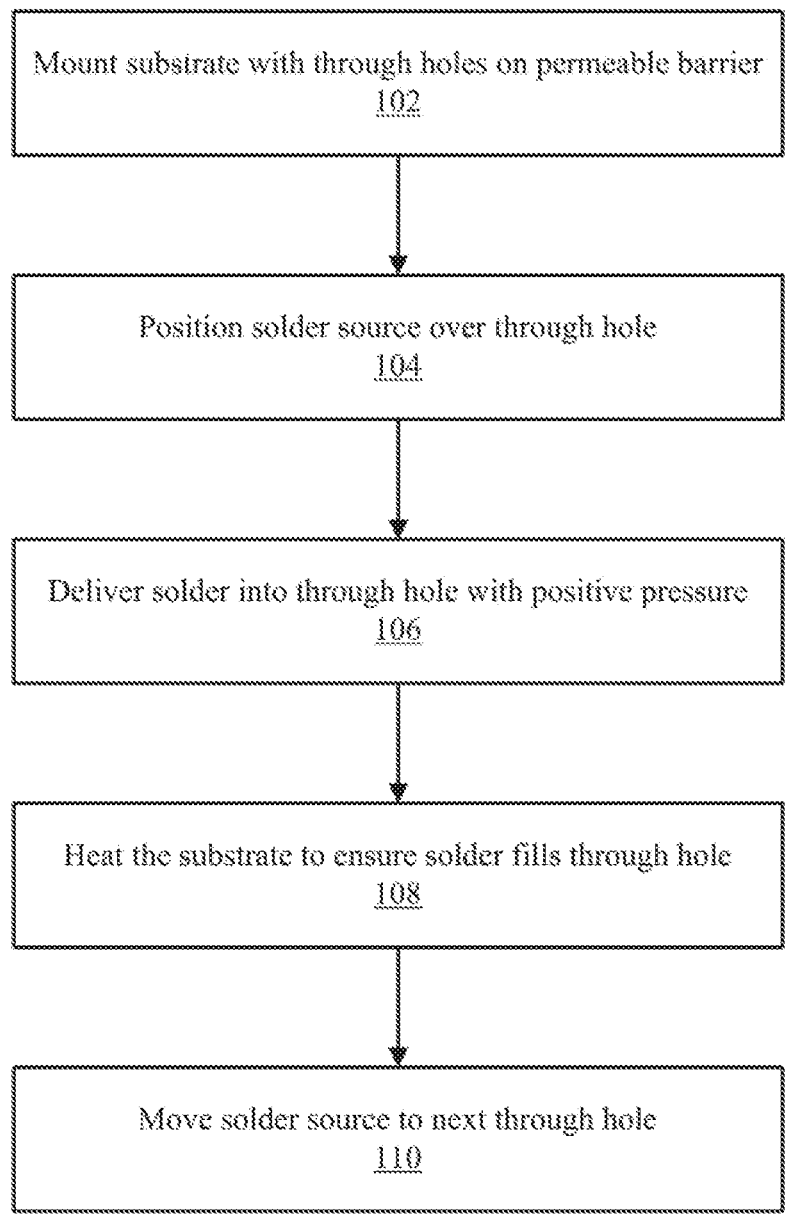
FIG. 3 is a block/flow diagram showing methods for filling one or more through holes with solder in accordance with illustrative embodiments.

Referring to FIG. 3, a method for filling a through hole with solder is shown in accordance with the present principles. In some alternative implementations, the functions noted in the blocks may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

In block 102, a substrate having one or more through holes is mounted on a permeable barrier layer. The permeable barrier is porous and enables gas to flow through the permeable barrier while blocking leakage of molten solder. In block 104, a solder source is positioned over a through hole. In block 106, molten solder is delivered into the through hole with a positive pressure from the solder source such that gas in the through holes passes the permeable barrier while the molten solder remains in the through hole.

In one embodiment, a solder reservoir is employed to store molten solder. The reservoir or a connection tube coupled to a scanning head may provide pressurization of the solder. The positive pressure is greater than 1 atmosphere.

In block 108, the permeable barrier and the substrate are heated to ensure the molten solder fills the through hole. The heat ensures that the solder stays molten to completely fill the through hole. The heating may be provided by a heated plate. A permeable plate may be disposed between the heated plate and the permeable barrier. The permeable plate further permits gas flow through the permeable plate.

The solder source may include a repositionable scanner head. In block 110, the scanning head (solder source) may be programmed so that it is positionable over a through hole and releases molten solder into the respective through hole. After filing the present through hole, the scanning head moves to a next through hole and continues to fill the through holes until completed.

In accordance with the present principles, the solder filling system and method permit through holes with a high aspect ratio to be completely filled. The high aspect ratio may include aspect ratios between 10 and 25, although greater or lesser aspect ratios may be employed and benefit in accordance with the present principles.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, may be used herein for ease of description to describe one element's or feature's relationship to another element(s) or feature(s) as illustrated in the FIGs. It will be understood that the spatially relative terms are intended to encompass different orientations of the device in use or operation in addition to the orientation depicted in the FIGs. For example, if the device in the FIGs. is turned over, elements described as "below" or "beneath" other elements or features would then be oriented "above" the other elements or features. Thus, the term "below" can encompass both an orientation of above and below. The device may be otherwise oriented (rotated 90 degrees or at other orientations), and the spatially relative descriptors used herein may be interpreted accordingly. In addition, it will also be understood that when a layer is referred to as being "between" two layers, it can be the only layer between the two layers, or one or more intervening layers may also be present.

It will be understood that, although the terms first, second, etc. may be used herein to describe various elements, these elements should not be limited by these terms. These terms are only used to distinguish one element from another element. Thus, a first element discussed below could be termed a second element without departing from the scope of the present concept.

Having described preferred embodiments for solder fill into high aspect through holes (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

What is claimed is:

1. A system for filling a through hole with solder, comprising:
    a heating plate;
    a permeable substrate mounted on the heating plate;
    a permeable barrier disposed on the permeable substrate, the permeable barrier having pores that enable gas to flow through the permeable barrier while preventing molten conductive solder from flowing through the permeable barrier, the permeable barrier configured to create an interface with a substrate having one or more through holes formed therein; and
    a repositionable scanning head configured to deliver molten conductive solder to the one or more through holes with a positive pressure.

2. The system as recited in claim 1, further comprising a pressurized solder reservoir in fluid communication with the scanning head.

3. The system as recited in claim 2, wherein the pressurized solder reservoir generates a positive pressure of greater than 1 atmosphere.

4. The system as recited in claim 1, wherein the through holes include an aspect ratio between 10 and 25.

5. The system as recited in claim 1, wherein the through holes include an aspect ratio greater than 25.

6. The system as recited in claim 1, wherein the permeable barrier includes pores having a pore size of less than about 1 micron.

7. The system as recited in claim 6, wherein the pores have a pore size of about 0.2 micron.

8. The system as recited in claim 1, wherein the permeable substrate includes a porous ceramic material.

9. The system as recited in claim 1, wherein the permeable substrate is configured to enable gas to flow through the permeable substrate.

10. The system as recited in claim 1, wherein the permeable barrier includes polytetrafluroethylene (PTFE).

11. The system as recited in claim 1, wherein a surface of the permeable barrier has a softness that is configured to reduce a formation of whiskers.

12. A system for filling a through hole with solder, comprising:
    a heating plate;
    a permeable substrate mounted on the heating plate;
    a permeable barrier disposed on the permeable substrate, the permeable barrier having pores that enable gas to flow through the permeable barrier while preventing molten conductive solder from flowing through the permeable barrier, the permeable barrier configured to create an interface with a substrate having one or more through holes formed therein; and
    delivery means configured to deliver molten conductive solder to the one or more through holes with a positive pressure.

13. The system as recited in claim 12, wherein the through holes include an aspect ratio between 10 and 25.

14. The system as recited in claim 12, wherein the through holes include an aspect ratio greater than 25.

15. The system as recited in claim 12, wherein the permeable barrier includes pores having a pore size of less than about 1 micron.

16. The system as recited in claim 15, wherein the pores have a pore size of about 0.2 micron.

17. The system as recited in claim 12, wherein the permeable substrate includes a porous ceramic material.

18. The system as recited in claim 12, wherein the permeable substrate is configured to enable gas to flow through the permeable substrate.

19. The system as recited in claim 12, wherein the permeable barrier includes polytetrafluroethylene (PTFE).

20. The system as recited in claim 12, wherein a surface of the permeable barrier has a softness that is configured to reduce a formation of whiskers.

* * * * *